(12) United States Patent
Oshino

(10) Patent No.: US 6,376,849 B1
(45) Date of Patent: Apr. 23, 2002

(54) CHARGED PARTICLE BEAM EXPOSURE APPARATUS MASK AND CHARGED PARTICLE BEAM EXPOSURE APPARATUS

(75) Inventor: Tetsuya Oshino, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/385,343

(22) Filed: Aug. 30, 1999

(30) Foreign Application Priority Data

Aug. 31, 1998 (JP) .......................................... 10-245521

(51) Int. Cl.$^7$ ........................ H01J 37/09; H01L 21/027
(52) U.S. Cl. ............................... 250/492.23; 250/505.1; 430/5; 430/296
(58) Field of Search ........................ 250/492.23, 492.2, 250/505.1; 430/5, 296

(56) References Cited

U.S. PATENT DOCUMENTS 5,672,449 A * 9/1997 Loschner et al. ............... 430/5

OTHER PUBLICATIONS

Liddle and Volkert, "Stress–induced Pattern–placement errors in Thin Membrane Masks," *J. Vac. Sci. Technol. B* 12(6), Nov./Dec. 1994, 3528–32.

Randall, "Pattern Distortions in Stencil Masks," *J. Vac. Sci. Technol. B* 12(6), Nov./Dec. 1994, 3543–46.

Behringer and Engelke, "Intelligent Design Splitting in the Stencil Mask Technology Used for Electron– and Ion–beam Lithography," *J. Vac. Sci. Technol. B* 11(6), Nov./Dec. 1993, 2400–03.

Wolfe et al., "Distortion Analysis of Stencil Masks with Stress–relief Structures," *J. Vac. Sci. Technol. B* 13(6), Nov./Dec. 1995, 2613–17.

* cited by examiner

*Primary Examiner*—Jack Berman
(74) *Attorney, Agent, or Firm*—Chapman and Cutler

(57) ABSTRACT

A charged particle beam exposure apparatus mask is provided such that, even if an internal tensile stress is applied to the mask, the amount of deformation of the circuit pattern remains within a range in which the transfer accuracy remains satisfactory. In the case a pattern 2 is placed on a square membrane 1, when the side length of the square membrane is denoted by L, and the magnitude of the internal tensile stress of the square membrane is denoted by $\sigma$(MPa), it has been discovered that the deformation amount of the circuit pattern is proportional to $\sigma \times L$. As a result of a computation, it has been discovered that the relation between the internal tensile stress $\sigma$(MPa) and the side length L of the square membrane needs to satisfy $\sigma \times L \leq 13$ in order to keep the position distortion of the circuit pattern less than 28 nm, below which no problem arises in performing an exposure-transfer.

16 Claims, 7 Drawing Sheets

CHARGED PARTICLE BEAM EXPOSURE APPARATUS MASK AND CHARGED PARTICLE BEAM EXPOSURE APPARATUS

BACKGROUND OF THE INVENTION

1. Field of the Invention

The present invention relates to a mask (in the present specification, the concept of "mask" includes reticles) to be used for a charged particle beam (for example, an electron beam) exposure apparatus and a charged particle beam exposure apparatus on which the mask is installed, and more particularly to a charged particle beam exposure apparatus mask whose transfer accuracy remains unchanged even if the pattern formed on the mask is deformed by the internal tension stress of the mask, and a charged particle beam exposure apparatus on which the mask is mounted.

2. Description of Related Art

A projection exposure apparatus for manufacturing semiconductors project-transforms a circuit pattern formed on a mask surface onto a substrate such as a wafer via an image forming device. A resist is coated on the substrate. When the resist coated on the substrate is exposed to an electron beam, a resist pattern is formed on the substrate. According to the electron beam exposure, which forms a pattern using an electron beam, the width of the electron beam can be reduced to several Angstroms. Therefore, a fine pattern of line width less than or equal to 1 $\mu$m can be formed, which is a primary characteristic of the projection exposure apparatus.

According to the conventional direct drawing type electron beam exposure system, a fine pattern is drawn by scanning an electron beam that converges to a micro size smaller than the line width of the pattern to be drawn. However, this method requires a long drawing time, and cannot obtain a high throughput, which is a major drawback. In order to solve this problem, an electron beam exposure apparatus which project-transfers a circuit pattern formed on a mask surface onto a wafer using an electron beam optical system has been developed as exemplified by the partition transfer system. This type of electron beam exposure apparatus achieves a higher throughput than the conventional straight drawing type electron beam exposure apparatus.

FIG. 5 shows the configuration of a conventional projection transfer type electron beam exposure apparatus. This apparatus is constituted of at least a mask 13, an irradiation device 11 which irradiates an electron beam 12 onto the mask 13, and an electron beam image forming device 15 which projects the electron beam 14 that has passed through the mask onto a substrate 17. The electron beam 12 emitted from the irradiation device 11 hits and passes through the mask 13. The electron beam 14 that has passed through the mask 13 is transformed into an electron beam 16 by the electron beam image forming device 15. This electron beam 16 forms an image of the pattern formed on the mask 13 on the substrate 17. The substrate 17 is, for example, a silicon wafer on which a resist is coated. The resist on the substrate 17 is then exposed to the projected electron beam 16.

The electron beam image forming device 15 reduce-projects the circuit pattern formed on the mask onto the substrate 17. As a result, the fine circuit pattern is exposed on the resist. In general, the electron beam image forming device 15 can obtain a high resolution only within a small area of size, for example, 1 mm×1 mm square, due to its optical limitation. On the other hand, the size of a semiconductor chip is about 20 mm×20 mm square. Therefore, the entire semiconductor chip cannot be transferred by a single exposure. Hence, the conventional electron exposure apparatus exposes the desired exposure region by irradiating with the electron beam 12 a portion of the mask, and scanning the electron beam 12. In the case the mask 13 is scanned in addition to the scan of the electron beam 12, the mask 13 is mounted on a scanning stage, and the scanning stage is scanned. For example, by scanning the electron beam 12 in a specific direction and scanning the mask 13 in a direction perpendicular to the specific direction, a wide area of the mask 13 can be exposed. In the case the mask 13 is scanned, the substrate 17 is scanned in the opposite direction in synchronization with the scanning direction of the mask 13.

FIG. 6 shows a portion of a cross section of the mask 13. The mask 13 has a self-supporting membrane member 18 (hereafter, this will be referred to as membrane 18.) as its principal portion. Penetration holes 19 are formed on the membrane 18 to form a pattern of the mask 13. The electron beam portions 12' that travel toward the penetration holes 19 pass through the penetration holes 19. However, the electron beam portions 12" that travel toward the other portion of the mask 13 are scattered or absorbed by the membrane 18. The electron beam image forming device 15 causes the electron beam portions 12' that pass through the penetration holes 19 to form an image of the pattern on the substrate 17.

In the above-described mask, the portion of the electron beam absorbed by the membrane portion of the mask generates heat. As a result, the mask is thermally expanded and deformed. This causes the shape of the pattern formed on the mask to be deformed also, which is a problem. To cope with this problem, the thickness of the membrane of the conventional electron beam exposure apparatus mask is made less than 10 $\mu$m so that a very small portion of the electron beam will be absorbed. That is, by making the membrane thin, a major portion of the electron beam is made to transmit through the membrane. This transmitting electron beam is scattered by the membrane. Hence, the transmitting electron beam can be removed by the electron beam image forming device so that only those electron beams that pass through the pattern portion will form an image on the substrate.

However, when the membrane is made so thin, the membrane is deflected by it own weight, which is a problem. In order to reduce the degree of this deflection cause by its own weight, an internal tensile stress is pre-applied to the membrane, for example, by adding an additive to the membrane.

In order to form a pattern on the mask, for example, a resist pattern is formed on the surface of the membrane, a removal process by dry-etching is applied to the membrane, and the resist pattern is transferred to the membrane. In this case, when penetration holes are formed on the membrane having an internal tensile stress, the membrane is deformed by the internal tensile stress, which is a problem. For example, in the case a rectangular circuit pattern 20 shown in FIG. 7(a) is exposed, if a penetration hole 21 similar to the circuit pattern as shown in FIG. 7(b) is formed on the membrane 18, the penetration hole 21 is deformed into a barrel-shape 21' as shown in FIG. 7(c) due to the internal tensile stress of the membrane 18. Therefore, the exposure pattern also becomes a barrel-shape.

In other words, due to the internal tensile stress that is applied to prevent the deflection generated by the weight of the membrane itself, the shape of the circuit pattern that is actually formed differs from the intended shape. The deformation of the mask pattern distorts the shape and position of the exposure pattern, which is a problem.

In exposing a circuit pattern of a semiconductor or the like, the position distortion of the exposure pattern needs to be suppressed to a low degree. For example, in the case a circuit pattern whose minimum line width is 130 nm is exposed, it is desirable that the position distortion of the mask having a reduction rate of 4 be set approximately below 28 nm.

Given these problems, it is an object of the present invention to provide a charged particle beam exposure apparatus mask such that, even if an internal tensile stress is applied to the mask, the degree of deformation of the circuit pattern remains within a range in which the transfer accuracy remains satisfactory, and a charged particle beam exposure apparatus on which such a mask is mounted.

SUMMARY OF THE INVENTION

The first means for solving the above-stated problems is a charged particle beam exposure apparatus mask comprising a membrane having an internal tensile stress to be used for an exposure apparatus that uses a charged particle beam, wherein the pattern to be exposed is made of penetration holes formed on the membrane that constitutes the mask such that the membrane is a square of side length L(mm), and wherein when the magnitude of the internal tensile stress is denoted by σ(MPa), the mask satisfies the following condition:

$$\sigma \times L \leq 13 \tag{1}$$

The inventor investigated the relation between the internal tensile stress of the membrane that constitutes the mask and the deformation amount of the circuit pattern formed on the membrane using the Finite Element Method. As a result, the inventor discovered that, in the case the membrane is a square, the deformation amount of the circuit pattern is proportional to the internal tensile stress as well as to the side length of the square. That is, if the side length of the square membrane and the internal tensile stress of the membrane are denoted by L and σ, respectively, then the deformation amount of the circuit pattern is proportional to σ×L. It is assumed here that the periphery of the square membrane is supported by a highly rigid member. FIG. 1 shows an exemplary square membrane 1 of side length 1.3 mm and a square pattern 2 placed near the edge portion of the membrane 1. FIG. 2 shows the deformation amount of the circuit pattern for various pattern sizes. In FIG. 2, the horizontal axis represents the size of the pattern (the side length of the square), and the vertical axis represents the maximum of the deformation amount. The deformation amount varies depending on the pattern size and is maximized when the pattern size is 500 μm. FIG. 2 shows the computation result when the internal tensile stress is 10 MPa. The maximum deformation amount in this case is about 27 nm, which is less than the maximum allowable position distortion 28 nm of the mask that is required in exposing a pattern whose minimum line width is 130 nm. In other words, when the size of the square membrane is 1.3 mm×1.3 mm, the internal tensile stress of the membrane needs to be suppressed to a value below 10 MPa.

A similar result was obtained in the case the position of the pattern was changed also. Based on the result of the above-described investigation, it is concluded that the internal tensile stress σ of the membrane (MPa) and the membrane size L (mm) need to satisfy the relation $$\sigma \times L \leq 13$$

in order to suppress the position distortion of the circuit pattern to a value below 28 nm at which no problem arises in performing an exposure-transfer.

The second means for solving the above-stated problems is a charged particle beam exposure apparatus mask comprising a membrane having an internal tensile stress to be used for an exposure apparatus that uses a charged particle beam, wherein a pattern to be exposed is made of penetration holes formed on the membrane that constitutes the mask such that the membrane is a rectangle having a short side length L(mm), and wherein when the magnitude of the internal tensile stress is denoted by σ(MPa), the mask satisfies the condition:

$$\sigma \times L \leq 11 \tag{2}$$

The inventor also investigated the relation between the internal tensile stress of the membrane that constitutes the mask and the deformation amount of the circuit pattern formed on the membrane using the Finite Element Method when the membrane is a rectangle. In this case also, the inventor discovered that the deformation amount of the circuit pattern is proportional to the internal tensile stress as well as to the length of the short side of the rectangle. That is, if the length of the short side of the rectangular membrane and the internal tensile stress of the membrane are denoted by L and σ, respectively, then the deformation amount of the circuit pattern is proportional to σ×L. It is also assumed here that the periphery of the square membrane is supported by a highly rigid member. FIG. 3 shows an exemplary rectangular membrane 3 whose short side length is 1.1 mm and a square pattern 4 of side length 500 μm placed near the edge portion of the membrane 3. FIG. 4 shows the result of computation of the pattern distortion amount of the circuit pattern. In FIG. 4, the horizontal axis represents the length of the long side of the rectangular membrane 3, and the vertical axis represents the maximum of the distortion amount. The distortion amount varies depending on the length of the long side of the rectangular membrane 3. The distortion amount initially increases as the length of the long side of the rectangular membrane 3 is increased, and remains constant once it achieves the maximum. FIG. 4 shows the computation result when the internal tensile stress of the membrane is 10 MPa. The maximum deformation amount in this case is about 27 nm, which is less than the maximum allowable position distortion 28 nm of the mask that is required in exposing a pattern whose minimum line width is 130 nm. In other words, when the length of the short side of the rectangular membrane is 1.1 mm, the internal tensile stress of the membrane needs to be suppressed to a value below 10 MPa.

A similar result was obtained in the case the position of the pattern was changed also. Based on the result of the above-described investigation, it is concluded that the internal tensile stress σ of the membrane (MPa) and the length L (mm) of the short side of the membrane size need to satisfy the relation σ×L≦11 in order to suppress the position distortion of the circuit pattern to a value below 28 nm at which no problem arises in performing an exposure-transfer.

The third means for solving the above-stated problems is a charged particle beam exposure apparatus mask as described in the first of second means, wherein the membrane is made of silicon or silicon compound.

The first and second means show that the distortion amount of the circuit pattern is proportional to the internal tensile stress of the membranes that constitute the mask. Hence, it is desirable that the internal tensile stress be made as small as possible within the range in which the membrane will not be deflected by its own weight. Therefore, it is desirable to construct the membrane using a material whose internal tensile stress can be made very small in consideration of the manufacturing process of the mask. For example, in the case a circuit pattern is manufactured by wet-etching a silicon wafer doped with boron, the magnitude of the internal stress can be reduced to about 30 MPa due to the added boron. In the case a circuit pattern is manufactured by electrochemical-wet-etching a silicon wafer doped with phosphorus, the magnitude of the internal stress can be reduced to about 10 MPa. Therefore, it is desirable that the membrane be constituted of silicon or silicon compound.

The fourth means for solving the above-stated problems is a charged particle beam exposure apparatus mask as described in any of the first through third means, wherein the length L of the short side of the membrane is less than 1.1 mm.

As described in the second means, if the length L of the short side (side length in the case of a square) of the membrane is less than 1.1 mm, the pattern distortion amount can be reduced to a value less than 28 nm even if the internal stress is 10 MPa, which is an advantage.

The fifth means for solving the above-stated problems is a charged particle beam exposure apparatus on which a charged particle beam exposure apparatus mask as described in any of the first through fourth means is mounted.

In this means, a mask having a circuit pattern whose distortion amount is less than 28 nm can be used. Therefore, a circuit pattern whose minimum width is 130 nm can be expose-transferred with a satisfactory degree of accuracy.

DESCRIPTION OF THE PREFERRED EMBODIMENT

In what follows, an embodiment of the present invention will be explained. A mask was manufactured based on the present invention. The mask is composed of multiple membranes. Each of the membranes is supported by beams made of silicon formed in the shape of a grid. The multiple membranes are arranged on the surface of the mask. Each of the membranes is a 1 mm×1 mm silicon square of thickness 2 $\mu$m. A circuit pattern was formed by forming several penetration holes on each of the membranes. The minimum pattern width was 0.52 $\mu$m. The silicon membrane was manufactured by etching a SOI wafer substrate. Boron was pre-added to the portion of the SOI wafer substrate that is to become a membrane. The amount of dope was adjusted so that the internal stress value will be between 5 MPa and 10 MPa when the SOI wafer substrate is shaped into the membrane. The internal tensile stress of the manufacture membrane was measured by the bulge method before being formed into the pattern. As a result, it has been confirmed that the internal tensile stress of the manufacture membrane lies in the range between 5 MPa and 10 MPa. Moreover, by the micro Raman spectroscopy method, it has been confirmed that the variance of the internal stress of the membrane lies in the range between 5 MPa and 10 MPa.

The pattern position distortion of the mask manufactured in this way was then measured. The distortion amount turned out to be below 24 nm, which is smaller than the target value 28 nm. Next, using a charged particle beam exposure apparatus mask according to the present invention, a semiconductor chip (a device having a prescribed circuit pattern) manufacturing method will be explained.

First, a silicon wafer is prepared. A silicon oxide film is then formed on the silicon wafer (film formation process).

To form the silicon oxide film, a conventional method is used such as the thermal oxidation method in which the silicon wafer is directly oxidized, or the CVD method, or the spatter method, or the like.

The thin films formed in the film formation process are determined by the basic patterns to be specified later. Conductive films such as aluminum films, insulating films such as silicon oxide films, high melting point metal films such as tungsten films, or the like are formed in the film formation process.

Figure 1:
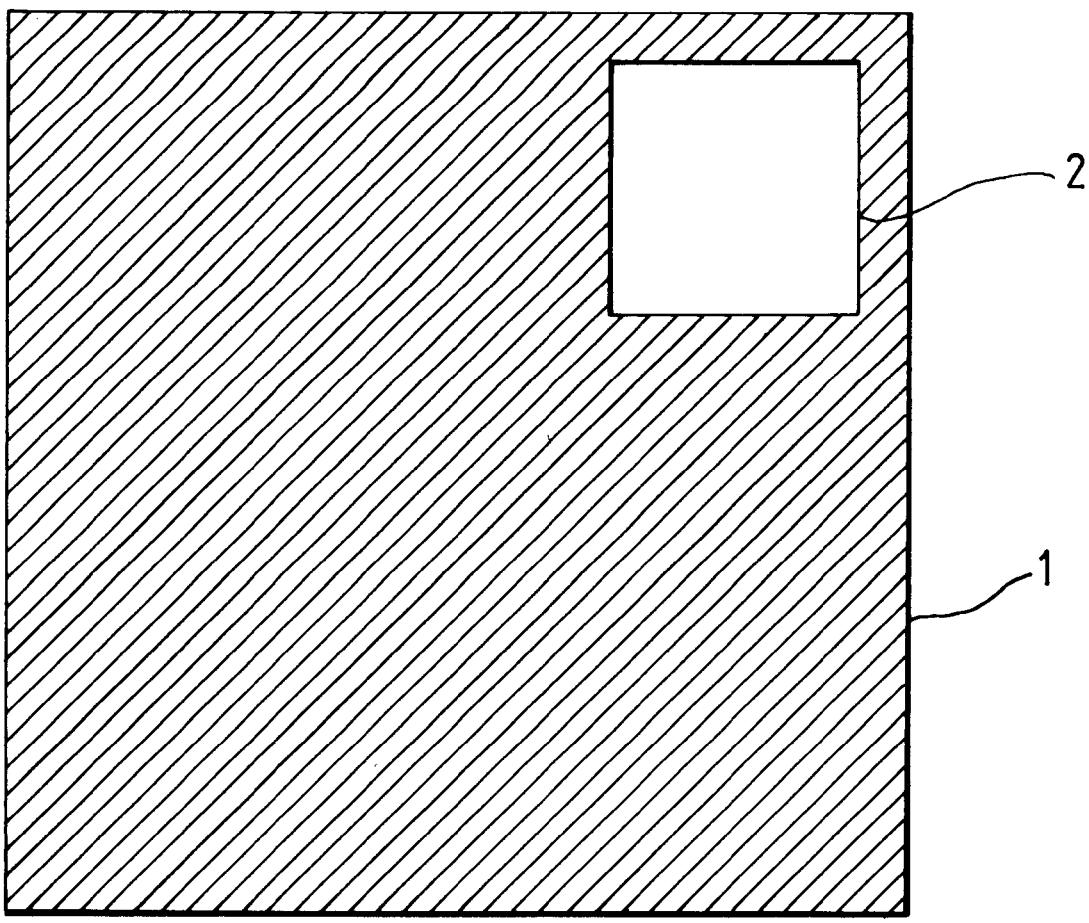
FIG. 1 shows an exemplary square membrane and an exemplary pattern that were used to calculate the pattern distortion amount.
Figure 2:
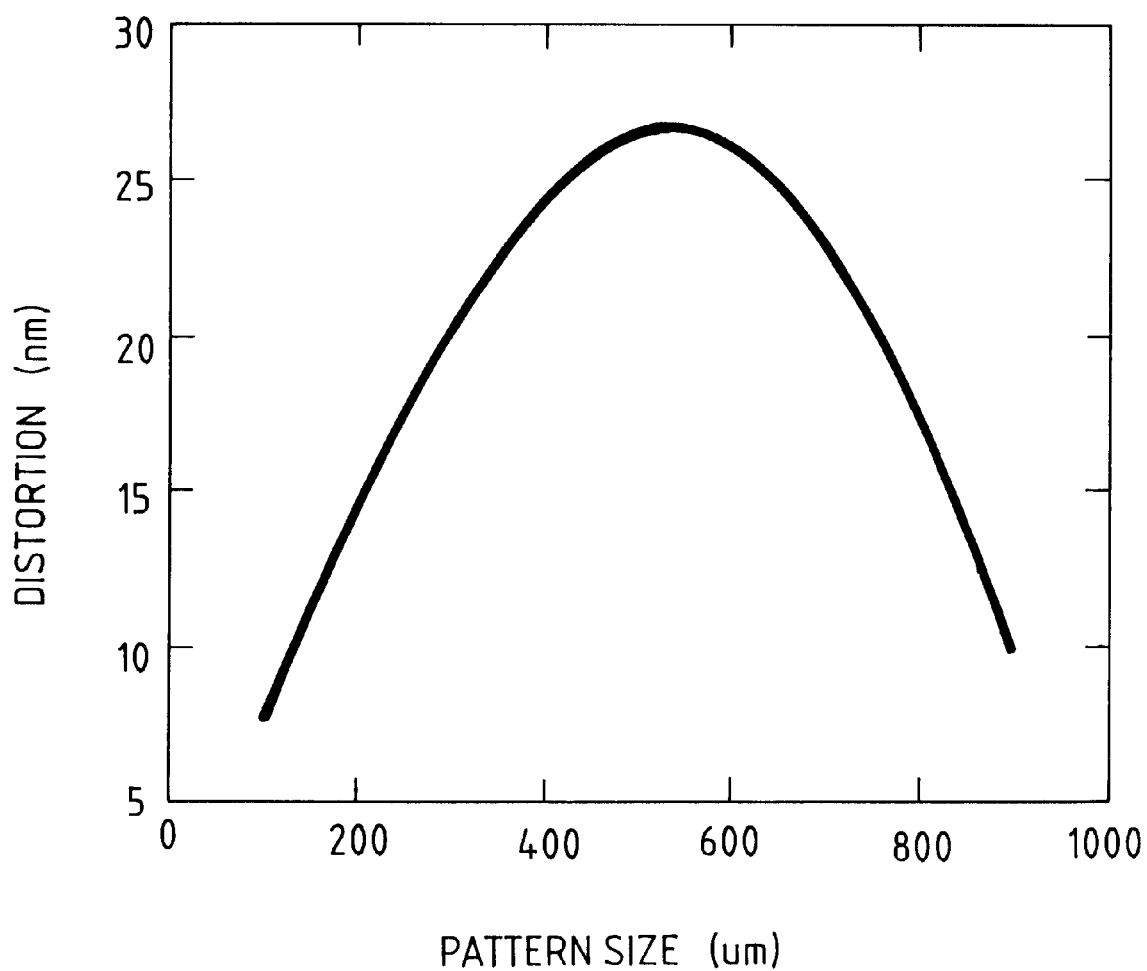
FIG. 2 shows the relation between the pattern size of a square membrane and the pattern distortion amount of the square membrane.
Figure 3:
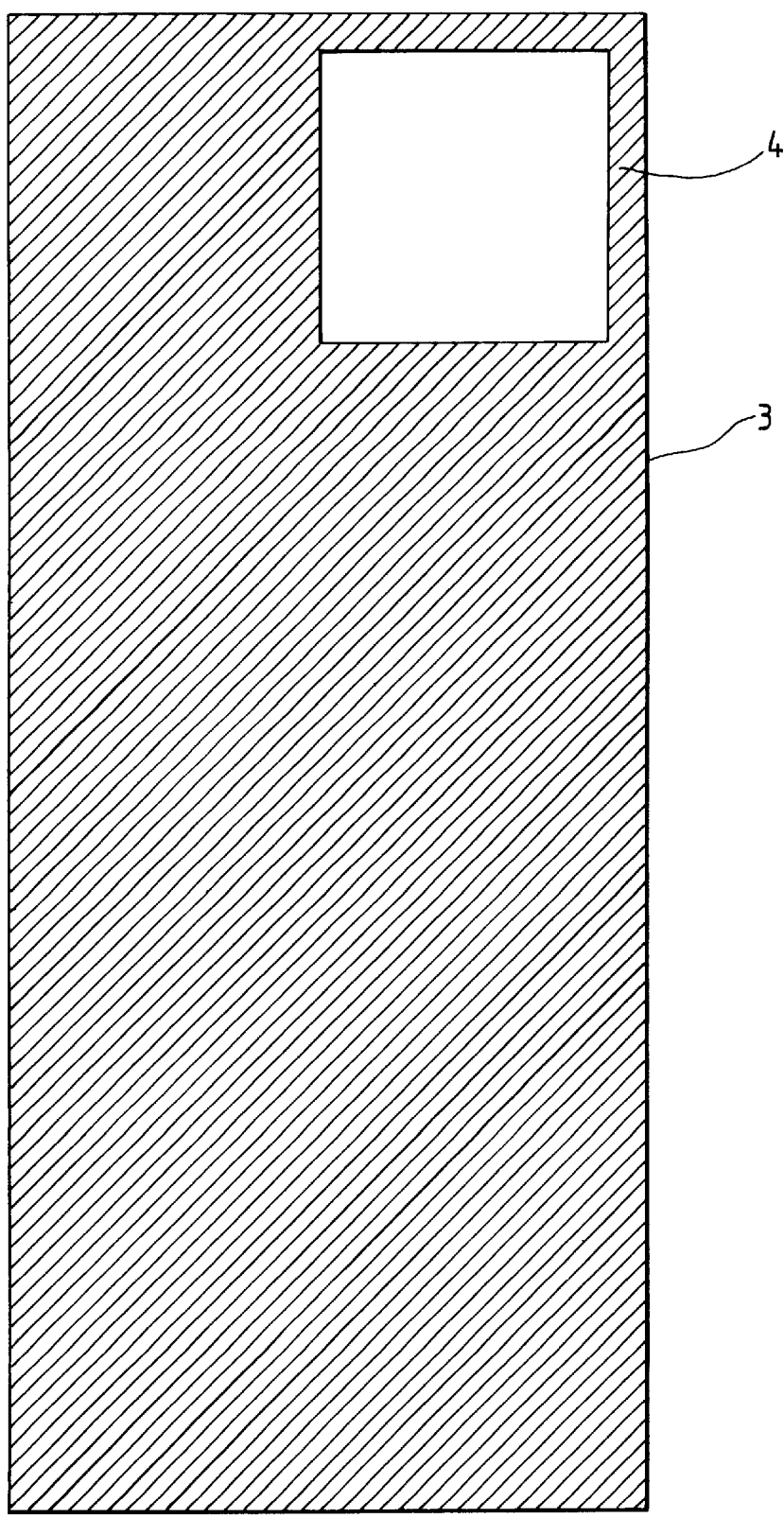
FIG. 3 shows an exemplary square membrane and an exemplary pattern that were used to calculate the pattern distortion amount.
Figure 4:
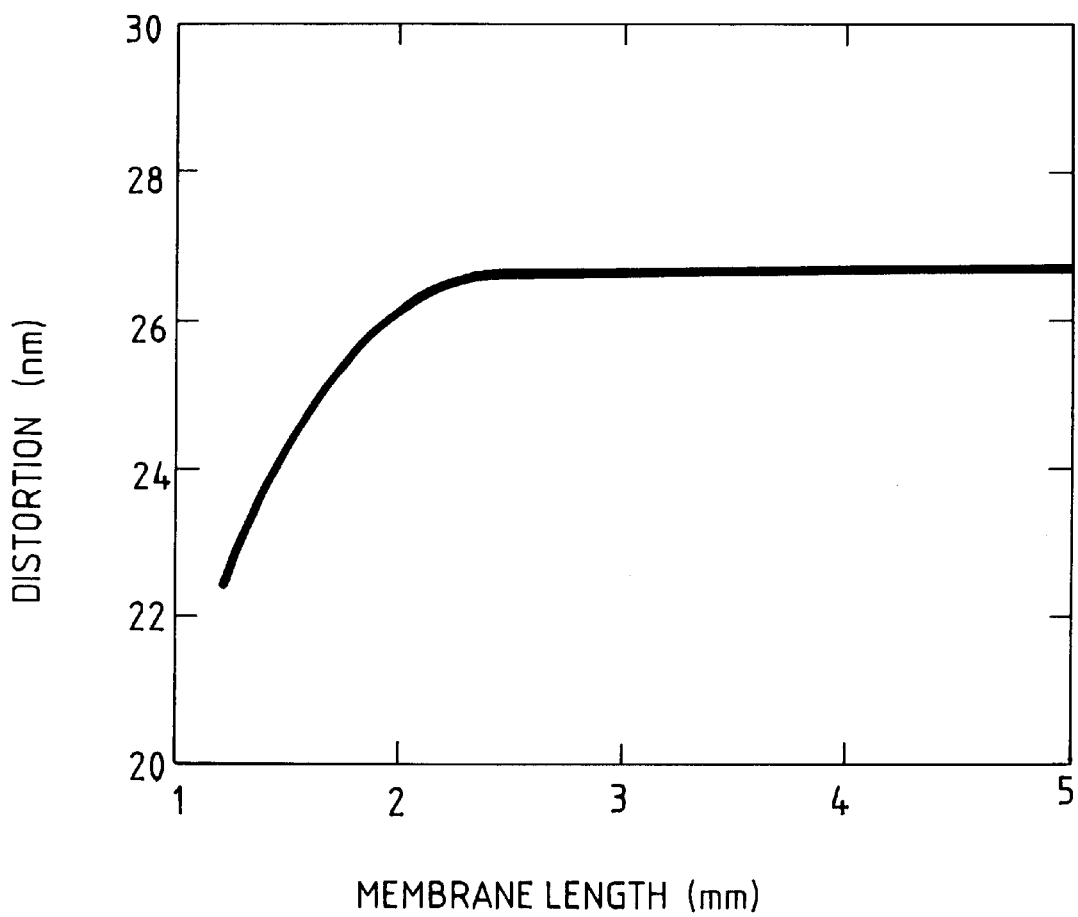
FIG. 4 shows the relation between the length of the long side of a rectangular membrane and the pattern distortion amount of the rectangular membrane.
Figure 5:
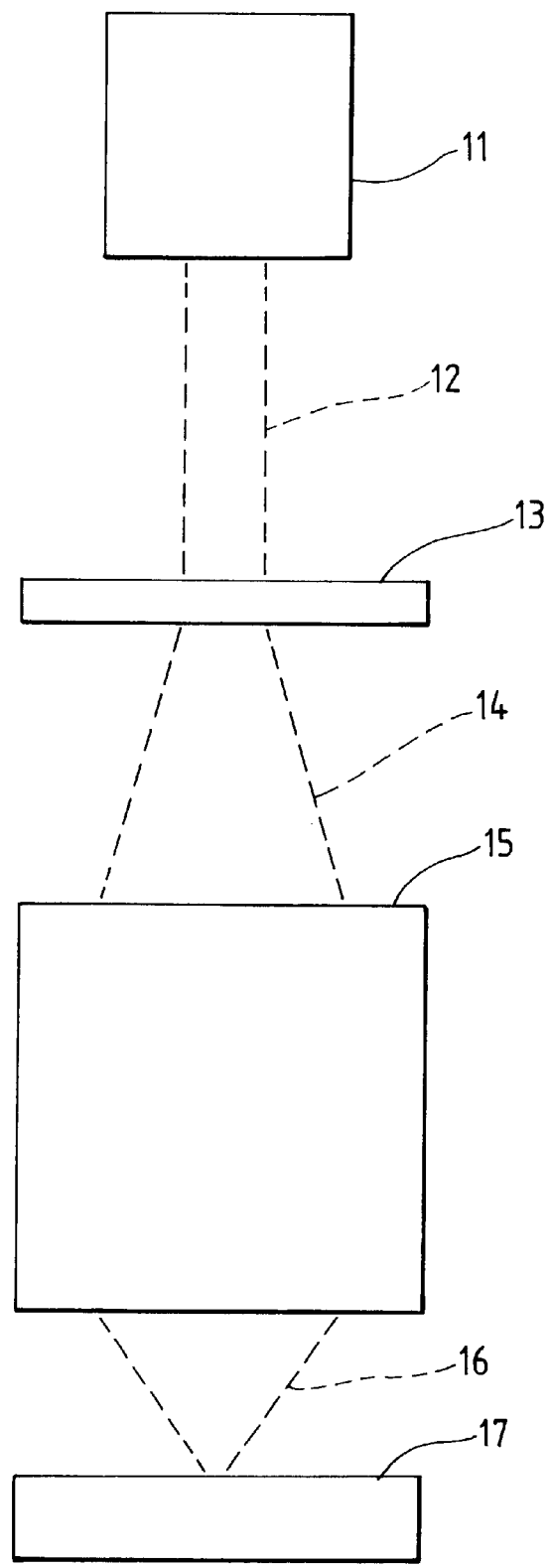
FIG. 5 shows the configuration of the schematic configuration of an exemplary electron beam exposure apparatus having a conventional mask.
Figure 6:
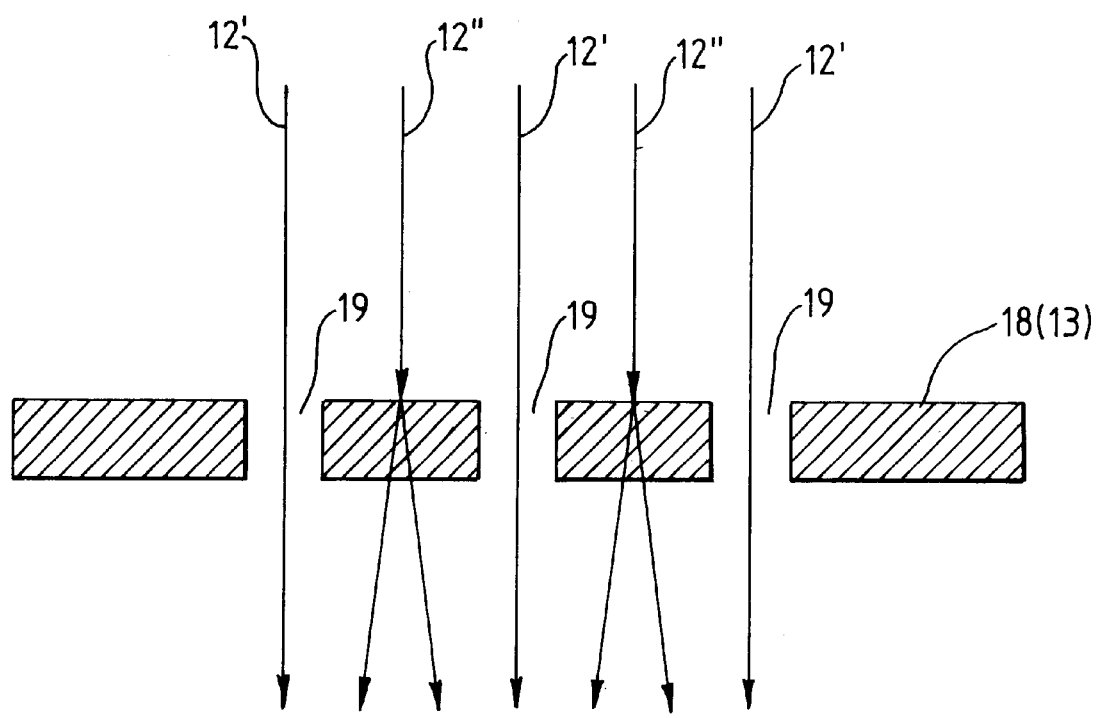
FIG. 6 is a magnified view of the conventional mask installed on the exemplary electron beam exposure apparatus.
Figure 7A:
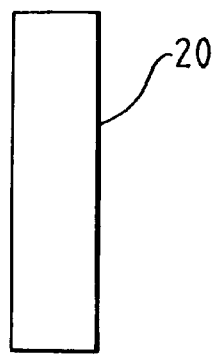
FIG. 7 shows the distortion of a pattern that is generated when a pattern is formed on the membranes that constitute the conventional mask.
Figure 7B:
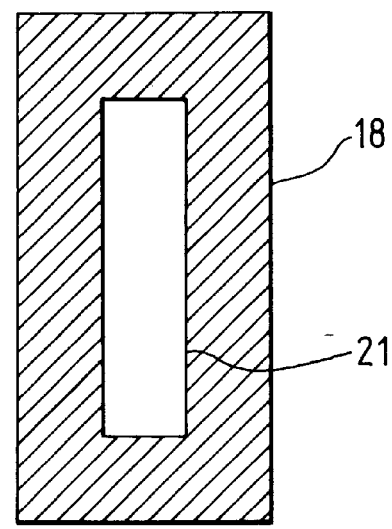
Figure 7C:
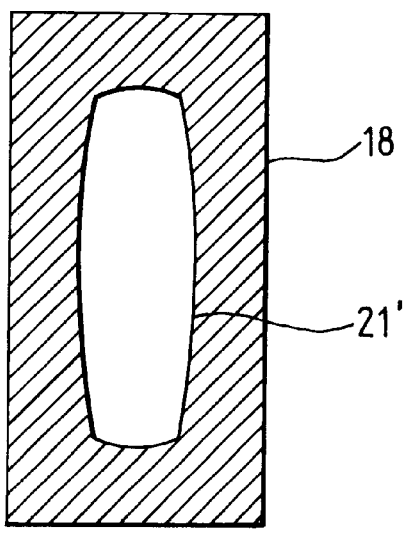
Figure 7D:
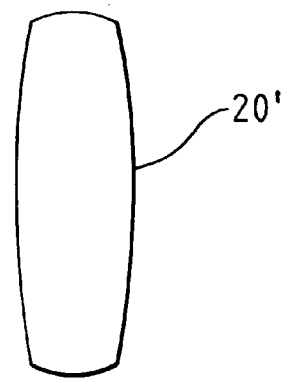

Next, a resist is coated on the silicon wafer on which the silicon oxide film is formed (photosensitive substrate). The silicon wafer is then placed on a wafer stage (not shown in the drawing) of a projection transfer type electron beam exposure apparatus as shown in FIG. 5. A charged particle beam exposure apparatus mask according to the present invention is then installed on a mask stage (not shown in the drawing).

The electron beam emitted from the irradiation device is irradiated onto the mask, passes through an opening pattern formed on the mask, and forms an image of the pattern formed on the mask onto the photosensitive substrate via the electron bean image forming device (lithography process).

Next, the resist onto which the prescribed pattern has been transferred is developed to form an etching mask. The silicon oxide film is then etched along the contour of the opening formed on the etching mask. After this, the etching mask is removed (etching process).

In the case an impurity layer is formed inside the silicon wafer, a resist pattern having an opening from which impurities are injected into the silicon wafer is first formed in the lithography process. Using this resist pattern as a mask, impurities such as B, P, As, or the like are introduced to the substrate by the ion injection method (doping process).

By repeating these processes (film formation process, lithography process, etching process, and doping process), basic patterns (for example, in the case of a MOS transistor, the pattern for specifying the device separation region (activation region), the pattern of the gate electrodes, the pattern for specifying the source/drain region, the pattern for forming contact holes for the wires for electrically connecting between the devices, the wire pattern for electrically connecting between the devices, or the like) are sequentially laminated on the wafer to manufacture a semiconductor device and an integrated circuit.

Next, the wires for electrically connecting between the devices on the silicon wafer are formed (metallizing process).

Next, the silicon wafer is cut along the dicing lines (the gap between the chips) to divide the silicon wafer into individual chips (dice) (dicing process).

Finally, the semiconductor chip is sealed in a package (assembly process).

By performing an exposure with an electron beam exposure apparatus using a mask according to the present embodiment, a resist having little pattern distortion was obtained. As a result, patterns on semiconductors were manufactured with a high yield.

Thus, according to the charged particle beam exposure apparatus mask of the present invention, the position distortion of the circuit pattern can be reduced to a level below 28 nm, which is not problematic in performing an exposure-transfer. As a result, a circuit pattern whose minimum width is 130 nm can be expose-transferred with a satisfactory degree of accuracy.

Moreover, since this mask is installed in the charged particle beam exposure apparatus according to the present invention, a circuit pattern whose minimum width is 130 nm can be expose-transferred with a satisfactory degree of accuracy.

What is claimed is:

1. A mask for a charged particle beam exposure apparatus, comprising a membrane with an internal tensile stress, wherein a pattern to be exposed is made by forming a plurality of penetration holes in said membrane that constitutes said mask such that said membrane is a square of side length L(mm), and wherein when a magnitude of said internal tensile stress is denoted by σ(MPa), said mask satisfies the following condition:

$$\sigma \times L \leq 13.$$

2. A charged particle beam exposure apparatus mask as claimed in claim 1, wherein said membrane is made of silicon or silicon compound.

3. A charged particle beam exposure apparatus mask as claimed in any of claims 1, wherein said length L of the side of said membrane is less than 1.1 mm.

4. A charged particle beam exposure apparatus mask as claimed in claim 2, wherein said length L of the side of said membrane is less than 1.1 mm.

5. A charged particle beam exposure apparatus comprising a mask of claim 1.

6. A charged particle beam exposure apparatus according to claim 5, wherein the membrane of the mask is made of silicon or silicon compound, and the length L of said square side of the membrane is less that 1.1 mm.

7. A mask for a charged particle beam exposure apparatus, comprising a membrane with an internal tensile stress, wherein a pattern to be exposed is made by forming a plurality of penetration holes in said membrane that constitutes said mask such that said membrane is a rectangle with a length of a short side L(mm), and wherein when a magnitude of said internal tensile stress is denoted by σ(MPa), said mask satisfies the following condition:

$$\sigma \times L \leq 11.$$

8. A charged particle beam exposure apparatus mask as claimed in claim 7, wherein said membrane is made of silicon or silicon compound.

9. A charged particle beam exposure apparatus mask as claimed in claim 7, wherein said length L of said short side of said membrane is less than 1.1 mm.

10. A charged particle beam exposure apparatus mask as claimed in claim 7, wherein said length L of said short side of said membrane is less than 1.1 mm.

11. A charged particle beam exposure apparatus comprising a mask of claim 7.

12. A charged particle beam exposure apparatus according to claim 11, wherein the membrane of the mask is made of silicon or silicon compound, and the length L of said short side of the rectangular membrane is less that 1.1 mm.

13. A method of manufacturing a semiconductor chip having a prescribed circuit pattern, comprising a lithography process having the steps of:

providing a charged particle beam exposure apparatus having a mask including a membrane with an internal tensile stress, the membrane being a square of side length L(mm), wherein a pattern to be exposed is made by forming a plurality of penetration holes in said membrane that constitutes said mask such that when a magnitude of said internal tensile stress is denoted by σ(MPa) said mask satisfies the condition σ×L≦13;

irradiating an electron beam generated by an irradiation device onto said mask of the charged particle beam exposure apparatus by scanning said electron beam; and having said electron beam that has passed through said mask transfer a pattern image formed on said mask onto a photosensitive substrate via an electron beam image forming device.

14. A method of manufacturing a semiconductor chip according to claim 13, wherein the mask of said charged particle beam exposure apparatus is a rectangle with a short side L, and the following condition is satisfied:

$$\sigma \times L \leq 11.$$

15. A method of manufacturing a semiconductor chip according to claim 13, wherein said mask of said charged particle beam exposure apparatus has a silicon or silicon compound membrane with the length L of the square side less than 1.1 mm.

16. A method of manufacturing a semiconductor chip according to claim 14, wherein said mask of said charged particle beam exposure apparatus mask has a silicon or silicon compound membrane with the length L of the short side of the rectangle less than 1.1 mm.

* * * * *